(12) United States Patent
Choi et al.

(10) Patent No.: US 12,334,922 B2
(45) Date of Patent: Jun. 17, 2025

(54) TERNARY LOGIC ELEMENT AND TERNARY LOGIC SYSTEM INCLUDING SAME

(71) Applicant: KOREA ADVANCED INSTITUTE OF SCIENCE AND TECHNOLOGY, Daejeon (KR)

(72) Inventors: Yang Kyu Choi, Daejeon (KR); Joon Kyu Han, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 186 days.

(21) Appl. No.: 18/366,119

(22) Filed: Aug. 7, 2023

(65) Prior Publication Data
US 2024/0137024 A1 Apr. 25, 2024
US 2024/0235554 A9 Jul. 11, 2024

(30) Foreign Application Priority Data
Oct. 19, 2022 (KR) .......... 10-2022-0135027

(51) Int. Cl.
*H03K 19/082* (2006.01)
(52) U.S. Cl.
CPC ................ *H03K 19/0823* (2013.01)
(58) Field of Classification Search
CPC .... H03K 19/0823; H03K 19/20; H10D 84/40; H10D 88/00
See application file for complete search history.

(56) References Cited

U.S. PATENT DOCUMENTS

| | | | | |
|---|---|---|---|---|
| 2002/0109151 A1* | 8/2002 | Spampinato | ......... | H10D 84/617 |
| | | | | 257/E27.039 |
| 2002/0158663 A1* | 10/2002 | Shemesh | ................... | G06F 7/49 |
| | | | | 326/59 |
| 2011/0278564 A1* | 11/2011 | Yoneda | ................ | H10D 86/423 |
| | | | | 257/43 |
| 2020/0382083 A1* | 12/2020 | Obu | ...................... | H10D 84/401 |
| 2022/0262935 A1* | 8/2022 | Thees | .................. | H10D 62/393 |
| 2023/0335557 A1* | 10/2023 | Park | ...................... | H10D 88/00 |

FOREIGN PATENT DOCUMENTS

| | | | | |
|---|---|---|---|---|
| CN | 111667863 A | * | 9/2020 | |
| DE | 19703780 A1 | * | 8/1998 | ......... H03K 19/0823 |
| DE | 102023100306 A1 | * | 7/2024 | |

\* cited by examiner

*Primary Examiner* — Seokjin Kim
(74) *Attorney, Agent, or Firm* — Maier & Maier, PLLC

(57) ABSTRACT

A ternary logic element including a transistor and a switching element. The transistor includes a channel layer including silicon, an input electrode, an output electrode, and a control electrode. The switching element includes an emitter, a base extending from the emitter, and a collector extending from the base. When a first control voltage is applied to the control electrode, the ternary logic element outputs a first voltage, and when a second control voltage different from the first control voltage is applied to the control electrode, the ternary logic element outputs a second voltage different from the first voltage, and when a third control voltage different from the first control voltage and the second control voltage is applied to the control electrode, the ternary logic element outputs a third voltage different from the first voltage and the second voltage.

15 Claims, 9 Drawing Sheets

< low state >

< middle state >

< high state >

TERNARY LOGIC ELEMENT AND TERNARY LOGIC SYSTEM INCLUDING SAME

CROSS-REFERENCE TO RELATED APPLICATIONS

This application claims the benefit under 35 U.S.C. § 119(a) of Korean Patent Application No. 10-2022-0135027, filed on Oct. 19, 2022, in the Korean Intellectual Property Office, which is incorporated herein by reference in its entirety.

FIELD

The present disclosure relates to a ternary logic element and a ternary logic system including the same, and more specifically, to a ternary logic element formed of a transistor and a separate switching element, and a ternary logic system including the same.

BACKGROUND

Binary logic systems that operate with 0 and 1 have dominated as conventional logic systems, but recently, multivalued logic systems have been developed as computer architectures for improving calculation efficiency.

When a multivalued logic system is used, the number of transistors and the number of wires can be significantly reduced so that integration can be increased and energy efficiency can be improved. Among multivalued logic systems, a ternary logic consisting of three logic states of "0," "1," and "2" is attracting attention as the simplest form of multivalued logic system.

In order to implement ternary logic, a new type of element capable of expressing three states is required. To this end, various devices such as carbon nanotube field effect transistors and graphene varistors have been proposed, but since these devices are not compatible with a complementary metal-oxide semiconductor (CMOS) technology and have high power consumption, commercialization of these devices is difficult. Therefore, it is necessary to develop a new type of ternary logic element that can be compatible with the CMOS technology and has low power consumption.

SUMMARY

Embodiments relate to a ternary logic element that is compatible with the existing complementary metal-oxide semiconductor (CMOS) technology and has low power consumption, and a ternary logic system including the same.

Embodiments also relate to a ternary logic element that has improved process efficiency and a high degree of integration, and a ternary logic system including the same.

A ternary logic element according to one embodiment of the present disclosure may include a transistor and a switching element. The transistor may include a channel layer including silicon, an input electrode, an output electrode, and a control electrode. The switching element may include an emitter, a base extending from the emitter, and a collector extending from the base, and any one of the emitter and the collector may be electrically connected to the channel layer and may be connected to the transistor in series. The emitter, the base, and the collector may each include silicon, the emitter and the collector may each be doped with either an n-type dopant or a p-type dopant, and the base may be doped with the other type of dopant. A first portion and a second portion spaced apart from the first portion of the channel layer may each be doped with the one type of dopant, a third portion disposed between the first portion and the second portion may be doped with the other type of dopant, and the first portion and the second portion may be in contact with the input electrode and the output electrode, respectively, In a ternary logic element, when a first control voltage is applied to the control electrode, a first voltage may be output, when a second control voltage different from the first control voltage is applied to the control electrode, a second voltage different from the first voltage may be output, and when a third control voltage different from the first control voltage and the second control voltage is applied to the control electrode, a third voltage different from the first voltage and the second voltage may be output.

When the first control voltage is applied to the control electrode, each of the transistor and the switching element may be turned off. When the second control voltage is applied to the control electrode, the transistor may be turned on and the switching element may be turned off. When the third control voltage is applied to the control electrode, each of the transistor and the switching element may be turned on.

A doping concentration of the base may be higher than a doping concentration of the third portion of the channel layer.

The switching circuit may further include a secondary electrode. The secondary electrode may overlap the base and not overlap the emitter and the collector.

The doping concentration of the base may be the same as the doping concentration of the third portion of the channel layer.

When a voltage is applied to the secondary electrode, a voltage for turning the switching element on may be varied.

The ternary logic element may include a semiconductor substrate, a semiconductor layer, an insulating portion, and a control electrode. The semiconductor substrate may include any one of a hole barrier material and an electron barrier material. The semiconductor layer may be formed on the semiconductor substrate and may include a first semiconductor portion, a second semiconductor portion extending from the first semiconductor portion, a third semiconductor portion extending from the second semiconductor portion, a fourth semiconductor portion extending from the third semiconductor portion, and a fifth semiconductor portion extending from the fourth semiconductor portion. The insulating portion may be disposed on the semiconductor layer and may overlap the second semiconductor portion and the fourth semiconductor portion. The control electrode may be disposed on the insulating portion and may overlap the second semiconductor portion. The first semiconductor portion, the third semiconductor portion, and the fifth semiconductor portion may each be doped with any one of an n-type dopant and a p-type dopant, and the second semiconductor portion and the fourth semiconductor portion may each be doped with the other type of dopant.

The semiconductor substrate may be any one among a silicon substrate, a silicon germanium substrate, a strained silicon substrate, a strained silicon germanium substrate, and a silicon carbide substrate.

The hole barrier material and the electron barrier material may each include any one among a buried oxide, a buried n-well, a buried p-well, buried SiC, and buried SiGe.

When a first control voltage is applied to the control electrode, a current may not flow in the first to fifth semiconductor portions, and when a second control voltage different from the first control voltage is applied to the control electrode, a current may flow between the first semiconductor portion and the third semiconductor portion, and a current may not flow between the third semiconductor portion and the fifth semiconductor portion, and when a third control voltage different from the first control voltage and the second control voltage is applied to the control electrode, a current may flow between the first semiconductor portion and the fifth semiconductor portion.

A doping concentration of the fourth semiconductor portion may be higher than a doping concentration of the second semiconductor portion.

The ternary logic element may further include a secondary electrode disposed on the insulating portion. The secondary electrode may overlap the fourth semiconductor portion and may not overlap the first semiconductor portion, the second semiconductor portion, the third semiconductor portion, and the fifth semiconductor portion.

A doping concentration of the fourth semiconductor portion may be the same as a doping concentration of the second semiconductor portion.

A ternary logic system may include a plurality of electronic elements and a ternary logic element.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
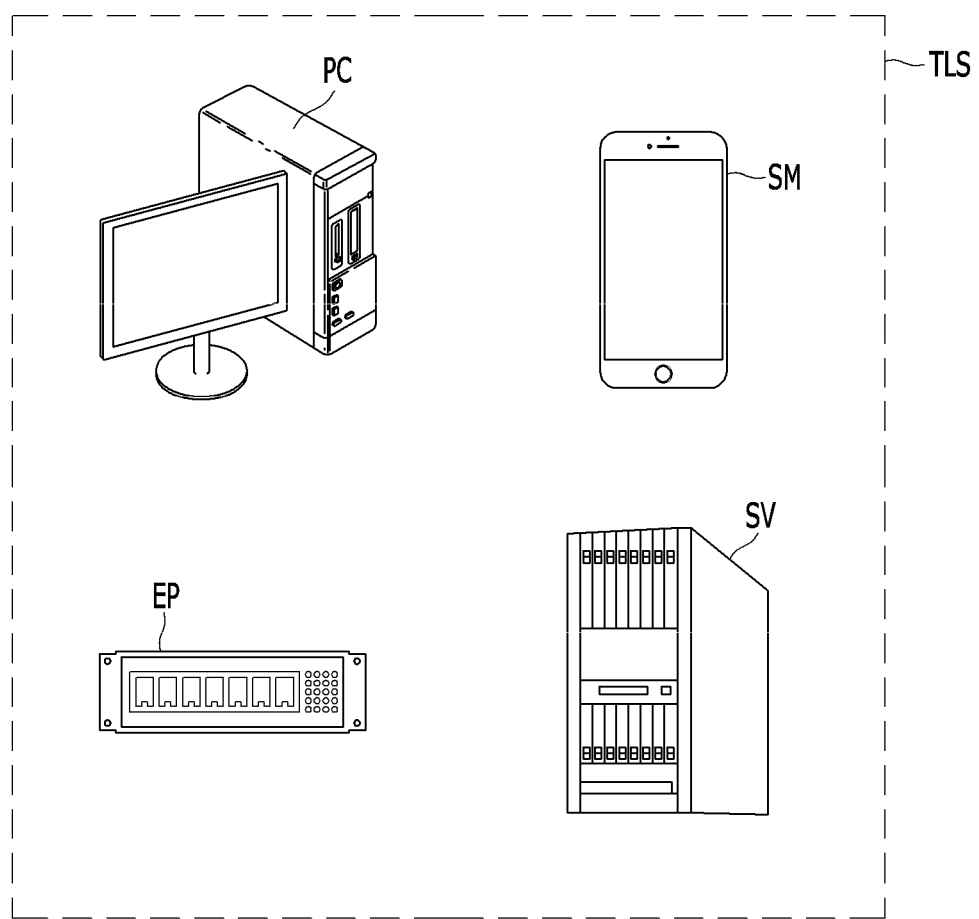
FIG. 1 is an exemplary diagram illustrating a ternary logic system according to one embodiment of the present disclosure.

Hereinafter, embodiments of the present disclosure will be described with reference to the accompanying drawings.

In the drawings, proportions and dimensions of components are exaggerated to effectively describe the technical content. The term "and/or" includes one or more combinations that associated components can define.

The term "comprising" is used to specify that a feature, a number, a step, an operation, a component, an element, or a combination thereof described herein exists, and does not preclude the presence or addition of one or more other features, numbers, steps, operations, components, elements, or combinations thereof.

Figure 2A:
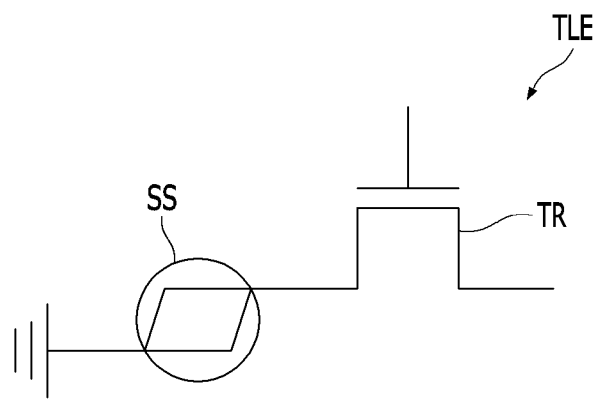
FIG. 2A is an exemplary diagram illustrating a circuit of the ternary logic element according to one embodiment of the present disclosure.
Figure 2B:
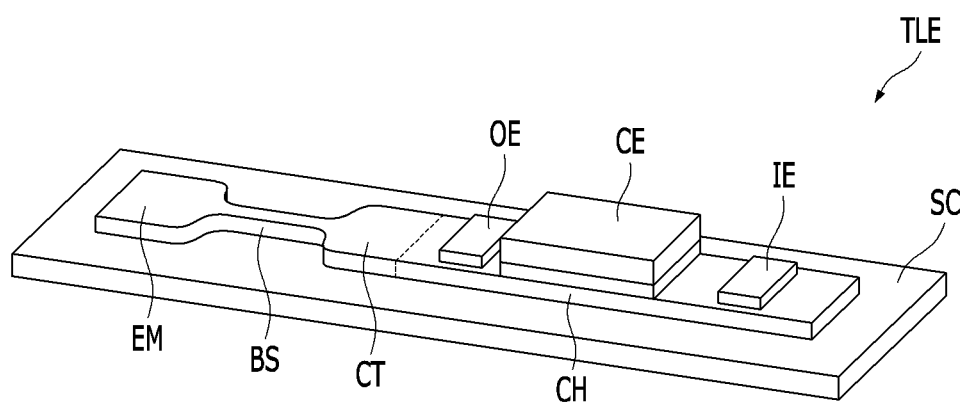
FIG. 2B is an exemplary diagram illustrating a structure of the ternary logic element according to one embodiment of the present disclosure.
Figure 2B:
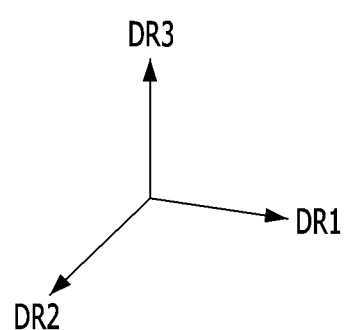

FIG. 1 is an exemplary diagram illustrating a ternary logic system TLS according to one embodiment of the present disclosure. FIG. 2A is an exemplary diagram illustrating a circuit of a ternary logic element TLE according to one embodiment of the present disclosure. FIG. 2B is an exemplary diagram illustrating a structure of the ternary logic element TLE according to one embodiment of the present disclosure.

The ternary logic system TLS including the ternary logic element TLE may be various electronic devices. In FIG. 1, a computer PC, a smartphone SM, an electric component EP, and a server (SV) are exemplarily shown as the ternary logic system TLS, but the present disclosure is not limited thereto. In addition to the ternary logic element TLE, the ternary logic system TLS may further include a plurality of electronic elements such as resistors, transistors, diodes, inductors, or capacitors.

Referring to FIGS. 2A and 2B, the ternary logic element TLE according to one embodiment of the present disclosure may include a semiconductor substrate SC, a transistor TR, and a switching element SS. The transistor TR and the switching element SS may be disposed on the semiconductor substrate SC.

The semiconductor substrate SC may include any one of a hole barrier material and an electron barrier material. The hole barrier material and the electron barrier material may each include any one among a buried oxide, a buried n-well, a buried p-well, buried SiC, and buried SiGe.

In one embodiment of the present disclosure, the semiconductor substrate SC may be any one among a silicon substrate, a silicon germanium substrate, a strained silicon substrate, a strained silicon germanium substrate, and a silicon carbide substrate.

In one embodiment of the present disclosure, the semiconductor substrate SC may operate as a back gate of the transistor TR.

The transistor TR may include a channel layer CH including silicon, an input electrode IE, an output electrode OE, and a control electrode CE.

The switching element SS may include an emitter EM, a base BS extending from the emitter EM in a first direction DR1, and a collector CT extending from the base BS in the first direction DR1.

In one embodiment of the present disclosure, the collector CT of the switching element SS may be in contact with the channel layer CH of the transistor TR. In another embodiment of the present disclosure, the emitter EM of the switching element SS may be in contact with the channel layer CH of the transistor TR. Thus, the switching element SS may be electrically connected to the channel layer CH.

Figure 3:
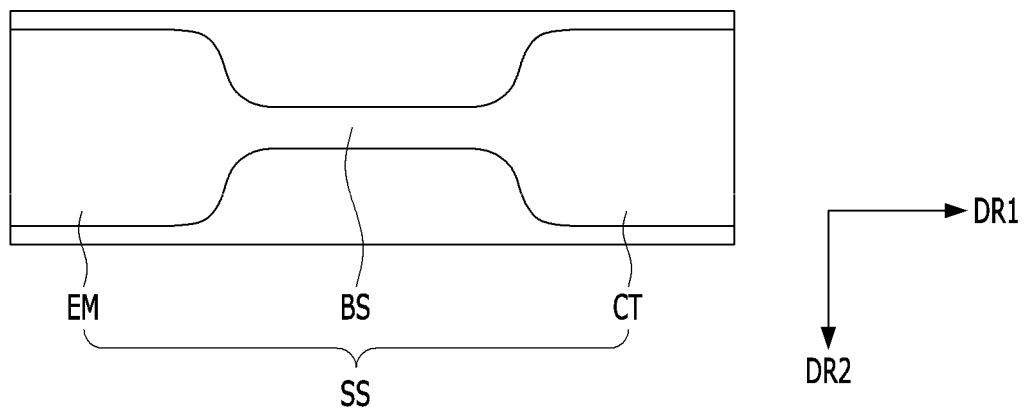
FIG. 3 is an exemplary diagram illustrating a shape of a switching element in a plan view.

FIG. 3 is an exemplary diagram illustrating a shape of the switching element SS in a plan view. An electrical characteristic of the switching element SS may be varied by adjusting a length of the base BS measured in the first direction DR1 and a length thereof measured in a second direction DR2.

In FIG. 3, the length of the base BS measured in the second direction DR2 is exemplarily illustrated as being smaller than a length of the emitter EM or the collector CT measured in the second direction DR2, but the present disclosure is not limited thereto.

Figure 4:
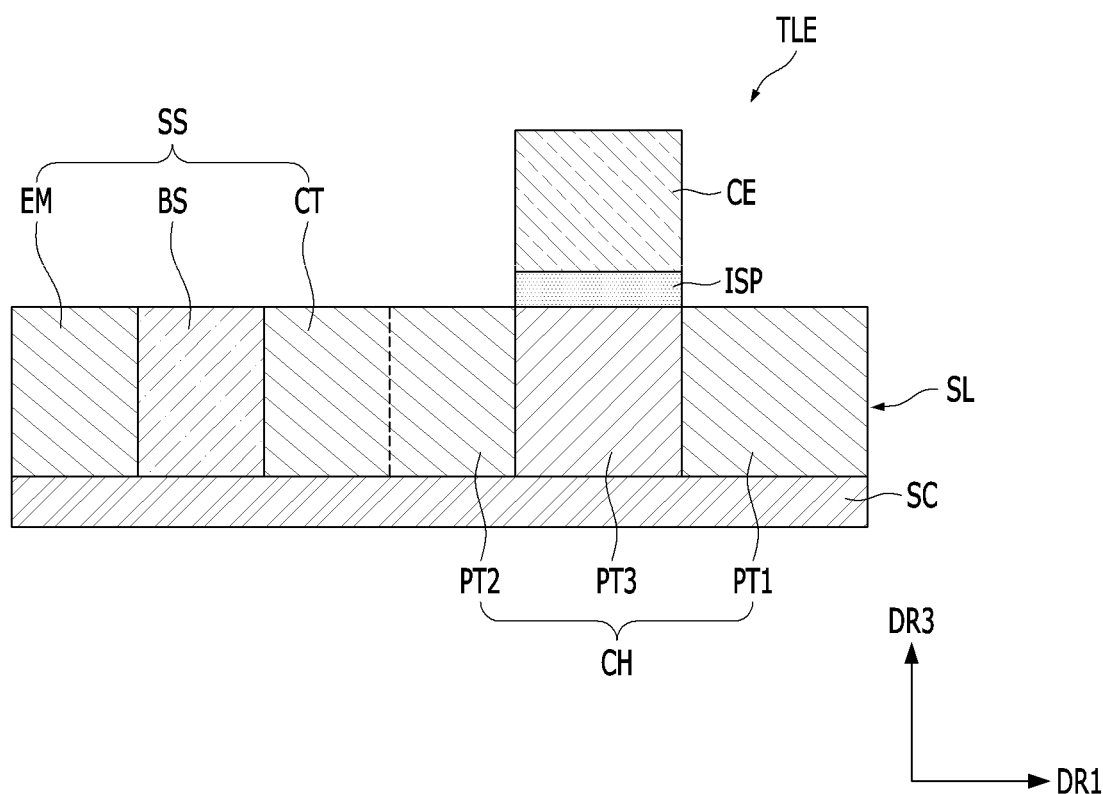
FIG. 4 is an exemplary diagram illustrating a portion of a cross section of the ternary logic element of FIG. 2B.

FIG. 4 is an exemplary diagram illustrating a portion of a cross section of the ternary logic element TLE of FIG. 2B. For convenience, the input electrode IE and the output electrode OE of the transistor TR are not shown in FIG. 4.

The emitter EM, the base BS, and the collector CT may each include at least one of silicon and a metal silicide. The emitter EM and the collector CT may each be doped with any one of an n-type dopant and a p-type dopant, and the base BS may be doped with the other type of dopant. For example, when the emitter EM and the collector CT are each doped with an n-type dopant, the base BS may be doped with a p-type dopant, whereas, when the emitter EM and the collector CT are each doped with a p-type dopant, the base BS may be doped with an n-type dopant.

In one embodiment of the present disclosure, the emitter EM and the collector CT may each be formed by at least one among diffusion, solid-phase diffusion, epitaxial growth, selective epitaxial growth, ion implantation, and subsequent heat treatment.

The switching element SS may be a bi-stable resistor (a biristor element) and may be an element having a bistable operating characteristic and characterized by an N—P—N-type semiconductor junction or a P—N—P-type semiconductor junction in which the N-type or P-type semiconductor in the middle of the junction is electrically floated.

An operating principle of the biristor is that, when a voltage is applied to a collector region, electrons are injected from an emitter region to a base region, and the injected electrons cause impact ionization due to a high electric field to generate holes paired therewith. The generated electrons directly exit to the collector region, and the holes are confined and accumulated in the base region floated electrically. In addition, a potential of the base region is reduced due to the accumulated holes, and thus a potential barrier between the emitter region and the base region is lowered. Thus, positive feedback, in which more electrons are introduced into the base region and more ion collisions occur to generate more holes paired therewith, occurs. When an appropriate voltage is applied to a collector region of a two-terminal biristor operating by the above-described positive feedback, a low current state ("0" state) changes to a high current state ("1" state) in which a current rapidly increases due to an electron avalanche effect. In addition, when the voltage is lowered to an appropriate level, the positive feedback structure is broken, and thus the high current state changes to the low current state in which the current rapidly decreases. In this case, a voltage when the low current state changes to the high current state is a latch-up voltage, and a voltage when the high current state changes to the low current state is a latch-down voltage. In addition, a hysteresis occurs due to the latch-up voltage and the latch-down voltage, and a difference between the latch-up voltage and the latch-down voltage is a latch voltage window. The smaller the latch-up voltage and the larger the latch voltage window, the higher the utilization value as a memory.

In one embodiment of the present disclosure, the channel layer CH may include a first portion PT1, a second portion PT2 spaced apart from the first portion PT1, and a third portion PT3 disposed between the first portion PT1 and the second portion PT2. In one embodiment of the present disclosure, the third portion PT3 may overlap the control electrode CE. An insulating portion ISP may be disposed between the third portion PT3 and the control electrode CE. The insulating portion ISP may include an inorganic material or an organic material.

In one embodiment of the present disclosure, the first portion PT1 and the second portion PT2 of the channel layer CH may be doped with the same type of dopant as the emitter EM and the collector CT, and the third portion PT3 may be doped with the same type of dopant as the base BS.

In one embodiment of the present disclosure, a doping concentration of the base BS may be higher than a doping concentration of the third portion PT3 of the channel layer CH. For example, the doping concentration of the base BS may be $1\times10^{17}$ cm$^{-3}$ or more, and the doping concentration of the third portion PT3 of the channel layer CH may be smaller than $1\times10^{17}$ cm$^{-3}$.

In the present specification, the first portion PT1 may be a first semiconductor portion, the third portion PT3 may be a second semiconductor portion, the second portion PT2 and the collector CT may be third semiconductor portions, the base BS may be a fourth semiconductor portion, and the emitter EM may be a fifth semiconductor portion. A semiconductor layer SL may be formed by the first to fifth semiconductor portions.

Since the collector CT of the switching element SS and the second portion PT2 of the transistor TR are formed as the third semiconductor portions at once, process efficiency can be improved and integration can be increased in manufacturing the ternary logic element TLE.

Figure 5:
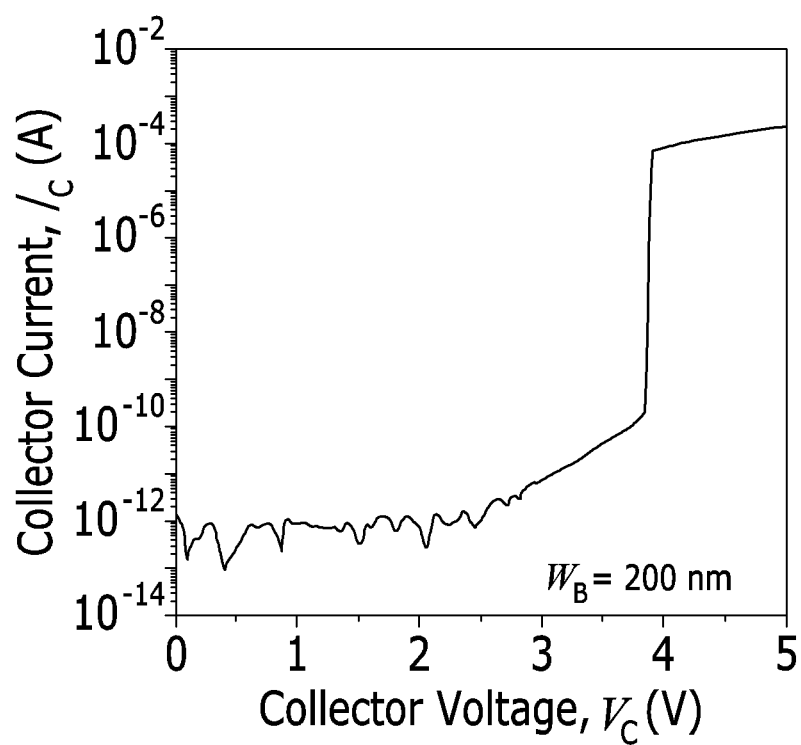
FIG. 5 is an exemplary diagram illustrating an electrical characteristic of the switching element.

FIG. 5 is an exemplary diagram illustrating an electrical characteristic of the switching element SS.

Referring to FIG. 5, a typical threshold switch characteristic in which a large collector current rapidly flows at a specific collector voltage Vc can be confirmed. The collector voltage Vc at this point may be referred to as a latch voltage.

By using the electrical characteristic of the switching element SS as shown in FIG. 5, the ternary logic element TLE may be formed and a ternary logic operation may be performed.

Figure 6A:
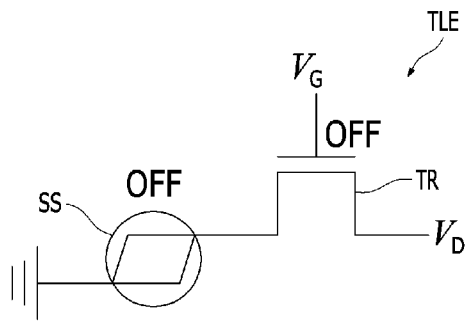
FIG. 6A is an exemplary diagram illustrating a state in which the ternary logic element operates.
Figure 6B:
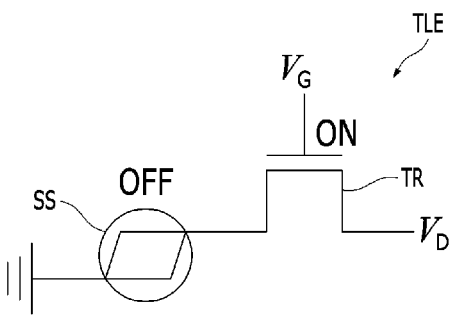
FIG. 6B is an exemplary diagram illustrating a state in which the ternary logic element operates.
Figure 6C:
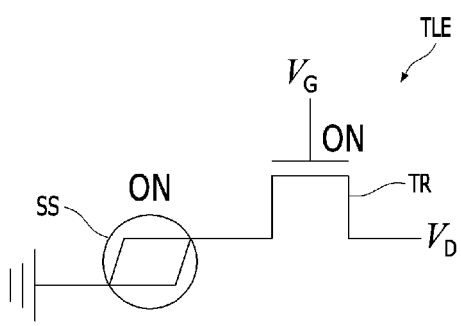
FIG. 6C is an exemplary diagram illustrating a state in which the ternary logic element operates.
Figure 7:
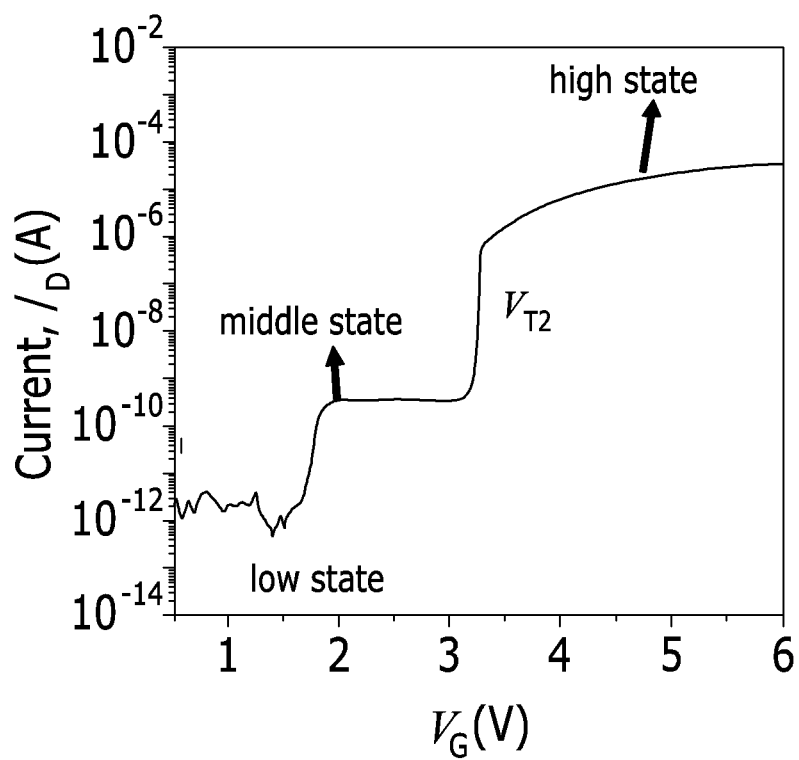
FIG. 7 is an exemplary diagram illustrating an electrical characteristic of the ternary logic element.

FIGS. 6A, 6B, and 6C are exemplary diagrams each illustrating a state in which the ternary logic element TLE operates. FIG. 7 is an exemplary diagram illustrating an electrical characteristic of the ternary logic element TLE.

Referring to FIG. 6A, in a low state in which a first control voltage is applied to the control electrode CE of the transistor TR, the transistor TR and the switching element SS may be turned off.

Referring to FIG. 6B, in a middle state in which a second control voltage different from the first control voltage is applied to the control electrode CE of the transistor TR, the transistor TR may be turned on, and the switching element SS may be turned off. In one embodiment of the present disclosure, the second control voltage may be greater than the first control voltage.

Referring to FIG. 6C, in a high state in which a third control voltage different from the first control voltage and the second control voltage is applied to the control electrode CE of the transistor TR, the transistor TR and the switching element SS may be turned on. In one embodiment of the present disclosure, the third control voltage may be greater than the second control voltage.

FIG. 7 exemplarily shows a current flowing in the transistor TR in the low state, the middle state, and the high state of FIGS. 6A to 6C, and it can be confirmed that, as the voltage applied to the control electrode CE of the transistor TR increases, the current flowing in the transistor TR increases gradationally. Since the current for maintaining the turning-off of the switching element SS in the middle state is small, power consumption of the switching element SS may be reduced.

Figure 8A:
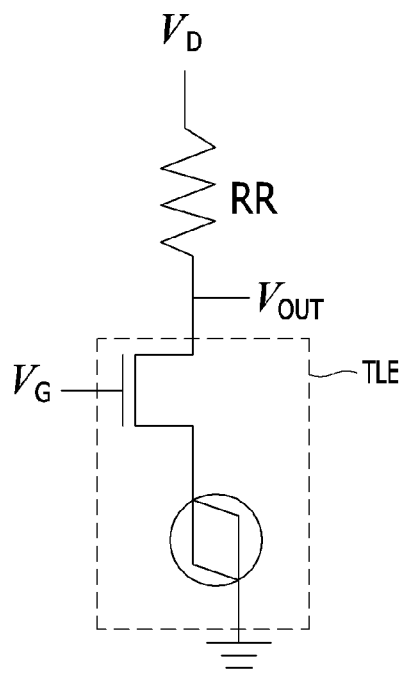
FIG. 8A is an exemplary diagram illustrating a circuit of an inverter using the ternary logic element according to one embodiment of the present disclosure.
Figure 8B:
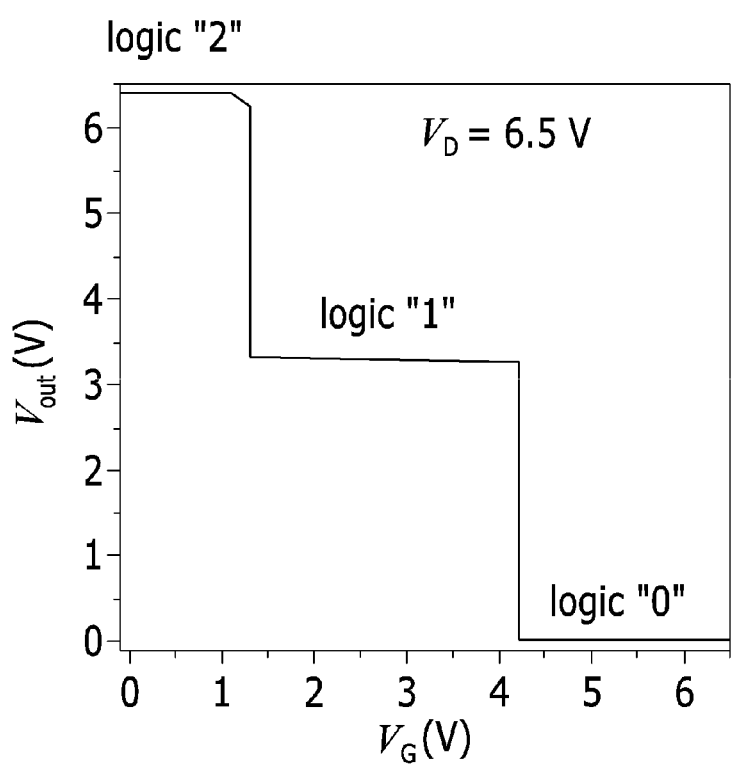
FIG. 8B is a graph for confirming an operating characteristic of the inverter shown in FIG. 8A.

FIG. 8A is an exemplary diagram illustrating a circuit of an inverter using the ternary logic element TLE according to one embodiment of the present disclosure. FIG. 8B is a graph for confirming an operating characteristic of the inverter shown in FIG. 8A. Specifically, FIG. 8B is a graph corresponding to a voltage transfer curve (VTC) characteristic of an inverter, which is obtained through simulation based on the circuit diagram of FIG. 8A.

Referring to FIG. 8A, the ternary logic element TLE and a load resistor RR may be connected in series.

Referring to FIG. 8B, it can be confirmed that a normal three-phase inverter characteristic, in which a logic "0" input is output as a logic "2," a logic "1" input is output as a logic "1," and a logic "2" input is output as a logic "0," is exhibited.

Figure 9:
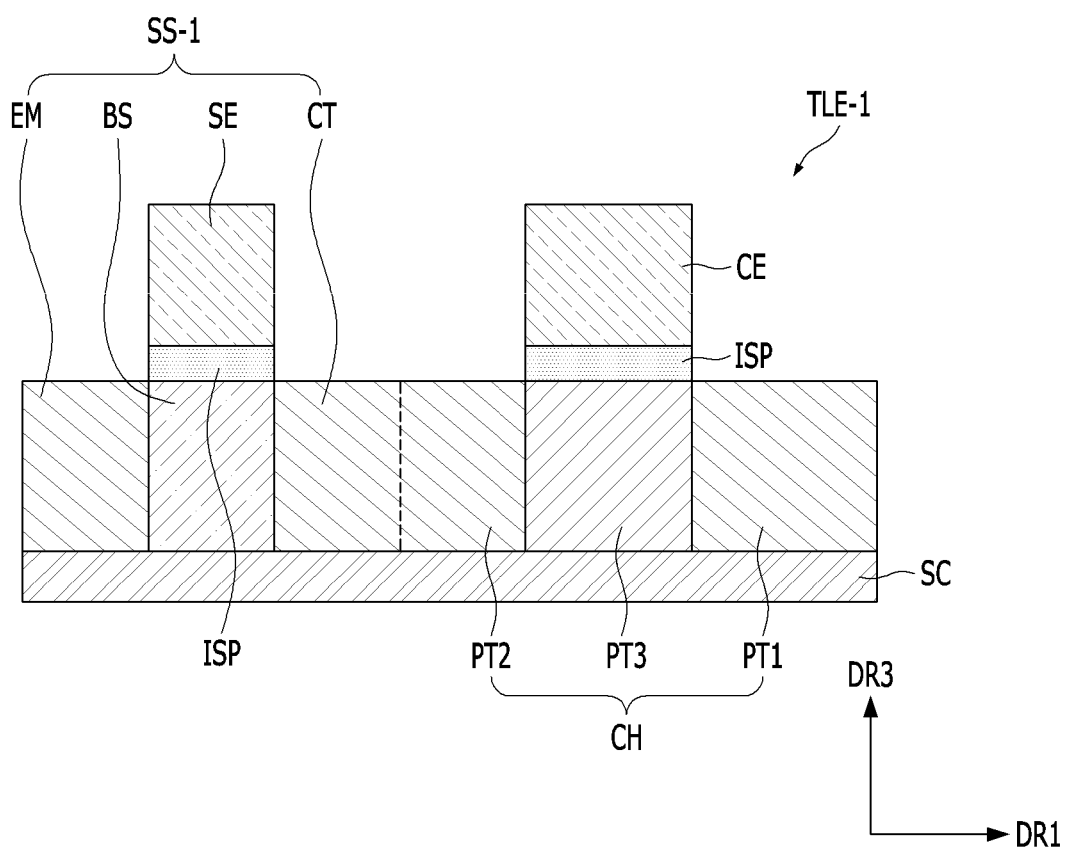
FIG. 9 is an exemplary diagram illustrating a portion of a cross section of the ternary logic element according to one embodiment of the present disclosure.

FIG. 9 is an exemplary diagram illustrating a portion of a cross section of a ternary logic element TLE-1 according to one embodiment of the present disclosure. Referring to FIG. 9, in one embodiment of the present disclosure, the ternary logic element TLE-1 may include a transistor TR and a switching element SS-1.

In one embodiment of the present disclosure, the switching element SS-1 may include an emitter EM, a base BS, a collector CT, and a secondary electrode SE.

The secondary electrode SE of the switching element SS-1 overlaps the base BS and does not overlap the emitter EM and the collector CT. An insulating portion ISP may be disposed between the secondary electrode SE and the base BS. In one embodiment of the present disclosure, the secondary electrode SE may be an electrically isolated dummy electrode which remains without being removed in a manufacturing process.

Descriptions of other components are substantially the same as those described in FIG. 4, except for the secondary electrode SE, and thus will be omitted.

Figure 10:
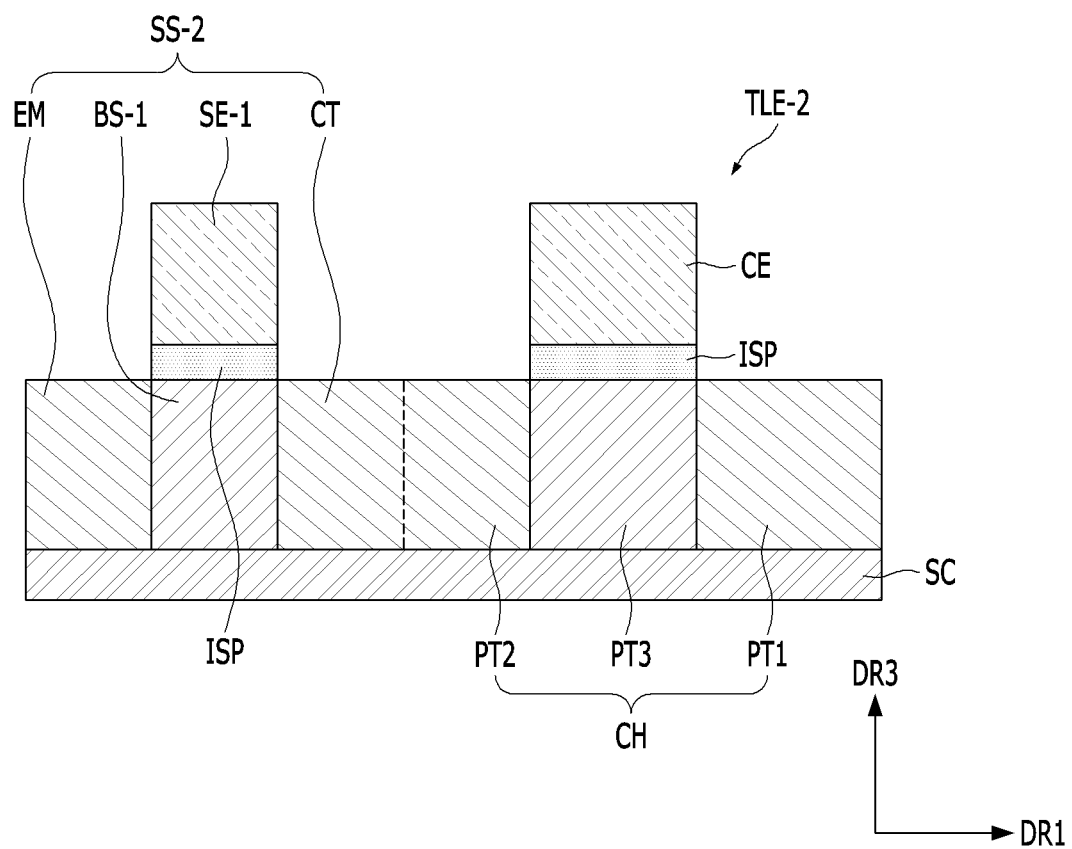
FIG. 10 is an exemplary diagram illustrating the portion of the cross section of the ternary logic element according to one embodiment of the present disclosure.

FIG. 10 is an exemplary diagram illustrating a portion of a cross section of a ternary logic element TLE-2 according to one embodiment of the present disclosure. Referring to FIG. 10, in one embodiment of the present disclosure, the ternary logic element TLE-2 may include a transistor TR and a switching element SS-2.

In one embodiment of the present disclosure, the switching element SS-2 may include an emitter EM, a base BS-1, a collector CT, and a secondary electrode SE-1.

In one embodiment of the present disclosure, a doping concentration of the base BS-1 may be the same as that of a third portion PT3 of a channel layer CH.

The secondary electrode SE-1 of the switching element SS-2 overlaps the base BS and does not overlap the emitter EM and the collector CT. An insulating portion ISP may be disposed between the secondary electrode SE-1 and the base BS. In one embodiment of the present disclosure, a voltage may be applied to the secondary electrode SE-1. An energy barrier is formed between the emitter EM and the base BS-1 due to the voltage applied to the secondary electrode SE-1 so that a latch voltage for turning the switching element SS on may be adjusted.

Descriptions of other components are substantially the same as those described in FIG. 4, except for the secondary electrode SE, and thus will be omitted.

In accordance with one embodiment of the present disclosure, it is possible to provide a ternary logic element having low power consumption, and a ternary logic system including the same.

In accordance with one embodiment of the present disclosure, it is possible to provide a ternary logic element that has improved process efficiency and a high degree of integration, and a ternary logic system including the same.

Although the description has been made with reference to the embodiments of the present disclosure, it should be understood that various alternations and modifications of the present disclosure can be devised by those skilled in the art to which the present disclosure pertains without departing from the spirit and scope of the present disclosure, which are defined by the appended claims. In addition, the embodiments disclosed in the present disclosure are not intended to limit the technical idea of the present disclosure, and all technical ideas within the scope of the following claims and their equivalents should be construed as being included in the scope of the present disclosure.

What is claimed is:

1. A ternary logic element comprising:
a transistor including a channel layer containing silicon, an input electrode, an output electrode, and a control electrode; and
a switching element which includes an emitter, a base extending from the emitter, and a collector extending from the base and in which any one of the emitter and the collector is electrically connected to the channel layer and is connected to the transistor in series,
wherein each of the emitter, the base, and the collector includes silicon,
each of the emitter and the collector is doped with any one of an n-type dopant and a p-type dopant, and the base is doped with the other type of dopant,
a first portion and a second portion spaced apart from the first portion of the channel layer are each doped with the one type of dopant, a third portion disposed between the first portion and the second portion is doped with the other type of dopant, and the first portion and the second portion are in contact with the input electrode and the output electrode, respectively,
when a first control voltage is applied to the control electrode, a first voltage is output,
when a second control voltage different from the first control voltage is applied to the control electrode, a second voltage different from the first voltage is output, and
when a third control voltage different from the first control voltage and the second control voltage is applied to the control electrode, a third voltage different from the first voltage and the second voltage is output.

2. The ternary logic element of claim 1, wherein:
when the first control voltage is applied to the control electrode, each of the transistor and the switching element is turned off;
when the second control voltage is applied to the control electrode, the transistor is turned on and the switching element is turned off; and
when the third control voltage is applied to the control electrode, each of the transistor and the switching element is turned on.

3. The ternary logic element of claim 2, wherein a doping concentration of the base is higher than a doping concentration of the third portion of the channel layer.

4. The ternary logic element of claim 2, wherein:
the switching circuit further includes a secondary electrode; and
the secondary electrode overlaps the base and does not overlap the emitter and the collector.

5. The ternary logic element of claim 4, wherein a doping concentration of the base is the same as a doping concentration of the third portion of the channel layer.

6. The ternary logic element of claim 5, wherein, when a voltage is applied to the secondary electrode, a voltage for turning the switching element on is varied.

7. A ternary logic element comprising:
a semiconductor substrate including any one of a hole barrier material and an electron barrier material;
a semiconductor layer which is formed on the semiconductor substrate and which includes a first semiconductor portion, a second semiconductor portion extending from the first semiconductor portion, a third semiconductor portion extending from the second semiconductor portion, a fourth semiconductor portion extending from the third semiconductor portion, and a fifth semiconductor portion extending from the fourth semiconductor portion;
an insulating portion which is disposed on the semiconductor layer and overlaps the second semiconductor portion and the fourth semiconductor portion; and
a control electrode which is disposed on the insulating portion and overlaps the second semiconductor portion,
wherein the first semiconductor portion, the third semiconductor portion, and the fifth semiconductor portion are each doped with any one of an n-type dopant and a p-type dopant, and the second semiconductor portion and the fourth semiconductor portion are each doped with the other type of dopant.

8. The ternary logic element of claim 7, wherein the semiconductor substrate includes any one among a silicon substrate, a silicon germanium substrate, a strained silicon substrate, a strained silicon germanium substrate, and a silicon carbide substrate.

9. The ternary logic element of claim 7, wherein each of the hole barrier material and the electron barrier material includes any one among a buried oxide, a buried n-well, a buried p-well, buried SiC, and buried SiGe.

10. The ternary logic element of claim 7, wherein:
when a first control voltage is applied to the control electrode, a current does not flow in the first to fifth semiconductor portions;
when a second control voltage different from the first control voltage is applied to the control electrode, a current flows between the first semiconductor portion and the third semiconductor portion, and a current does not flow between the third semiconductor portion and the fifth semiconductor portion; and
when a third control voltage different from the first control voltage and the second control voltage is applied to the control electrode, a current flows between the first semiconductor portion and the fifth semiconductor portion.

11. The ternary logic element of claim 10, wherein a doping concentration of the fourth semiconductor portion is higher than a doping concentration of the second semiconductor portion.

12. The ternary logic element of claim 10, further comprising a secondary electrode disposed on the insulating portion,
wherein the secondary electrode overlaps the fourth semiconductor portion and does not overlap the first semiconductor portion, the second semiconductor portion, the third semiconductor portion, and the fifth semiconductor portion.

13. The ternary logic element of claim 12, wherein a doping concentration of the fourth semiconductor portion is the same as a doping concentration of the second semiconductor portion.

14. A ternary logic system comprising:
a plurality of electronic elements; and
a ternary logic element,
wherein the ternary logic element includes:
a transistor including a channel layer containing silicon, an input electrode, an output electrode, and a control electrode; and
a switching element which includes an emitter, a base extending from the emitter, and a collector extending from the base and in which any one of the emitter and the collector is electrically connected to the channel layer and is connected to the transistor in series,
each of the emitter, the base, and the collector includes silicon,
each of the emitter and the collector is doped with any one of an n-type dopant and a p-type dopant, and the base is doped with the other type of dopant,
a first portion and a second portion spaced apart from the first portion of the channel layer are each doped with the one type of dopant, a third portion is doped with the other type of dopant, and the first portion and the second portion are in contact with the input electrode and the output electrode, respectively,
when a first control voltage is applied to the control electrode, a first voltage is output,
when a second control voltage different from the first control voltage is applied to the control electrode, a second voltage different from the first voltage is output, and
when a third control voltage different from the first control voltage and the second control voltage is applied to the control electrode, a third voltage different from the first voltage and the second voltage is output.

15. The ternary logic system of claim 14, wherein:
when the first control voltage is applied to the control electrode, each of the transistor and the switching element is turned off;
when the second control voltage is applied to the control electrode, the transistor is turned on and the switching element is turned off; and
when the third control voltage is applied to the control electrode, each of the transistor and the switching element is turned on.

* * * * *